United States Patent
Hioka et al.

(10) Patent No.: US 9,741,924 B2
(45) Date of Patent: Aug. 22, 2017

(54) MAGNETIC SENSOR HAVING A RECESSED DIE PAD

(71) Applicant: SII Semiconductor Corporation, Chiba-shi, Chiba (JP)

(72) Inventors: Takaaki Hioka, Chiba (JP); Mika Ebihara, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/050,827

(22) Filed: Feb. 23, 2016

(65) Prior Publication Data
US 2016/0254441 A1    Sep. 1, 2016

(30) Foreign Application Priority Data

Feb. 26, 2015  (JP) ................ 2015-037331
Dec. 24, 2015  (JP) ................ 2015-252369

(51) Int. Cl.
| | |
|---|---|
| *H01L 43/04* | (2006.01) |
| *H01L 43/06* | (2006.01) |
| *H01L 43/14* | (2006.01) |
| *G01R 33/00* | (2006.01) |
| *G01R 33/07* | (2006.01) |

(52) U.S. Cl.
CPC .......... *H01L 43/04* (2013.01); *G01R 33/0052* (2013.01); *G01R 33/07* (2013.01); *H01L 43/065* (2013.01); *H01L 43/14* (2013.01)

(58) Field of Classification Search
CPC ....... H01L 43/04; H01L 43/065; H01L 43/14; G01R 33/0052; G01R 33/07
See application file for complete search history.

(56) References Cited

U.S. PATENT DOCUMENTS

| | | | | |
|---|---|---|---|---|
| 8,169,215 | B2* | 5/2012 | Kataoka | G01R 33/0011 324/251 |
| 8,981,504 | B2* | 3/2015 | Motz | G01R 33/07 257/414 |
| 9,453,890 | B2* | 9/2016 | Yamashita | H01L 43/08 |
| 2007/0200564 | A1* | 8/2007 | Motz | G01R 33/095 324/247 |
| 2010/0117638 | A1* | 5/2010 | Yamashita | G01R 33/07 324/233 |
| 2015/0002145 | A1* | 1/2015 | Ausserlechner | G01P 15/123 324/251 |

(Continued)

FOREIGN PATENT DOCUMENTS

JP        2016017830 A  *  2/2016

OTHER PUBLICATIONS

Abstract, Publication No. JP 2003-130936, Publication Date May 8, 2003.

(Continued)

*Primary Examiner* — Ida M Soward
(74) *Attorney, Agent, or Firm* — Adams & Wilks

(57) ABSTRACT

A magnetic sensor has a pair of Hall elements formed in spaced-apart relationship on a front surface of a semiconductor substrate. A die pad is bonded to a back surface of the semiconductor substrate and overlaps the Hall elements. The die pad has formed therein a magnetic converging plate holder having a recessed portion, and a magnetic converging plate having the same shape and size as the recessed portion is fitted in the recessed portion of the magnetic converging plate holder.

5 Claims, 3 Drawing Sheets

(56) References Cited

U.S. PATENT DOCUMENTS

2016/0190433 A1* 6/2016 Kosier ............... G01R 33/077
257/427

OTHER PUBLICATIONS

Abstract, Publication No. JP 2012-047708, Publication Date Mar. 8, 2012.
Abstract, Publication No. JP 2012-151285, Publication Date Aug. 9, 2012.

* cited by examiner

Formation of Hall element

Formation of base conductive layer

Formation of resist pattern for converging plate

Formation of converging plate by plating

Removal of resist

MAGNETIC SENSOR HAVING A RECESSED DIE PAD

BACKGROUND OF THE INVENTION

1. Field of the Invention

The present invention relates to a magnetic sensor that includes a magnetic converging plate and is configured to detect magnetic fields in a vertical direction and a horizontal direction, and to a method of manufacturing the magnetic sensor.

2. Description of the Related Art

Hall elements allow non-contact position detection and non-contact angle detection as magnetic sensors, and are thus often used in various applications.

First, the principle of magnetic detection with the Hall elements is described. When a magnetic field is applied vertically to a current flowing through a substance, an electric field (Hall voltage) is generated in a direction vertical to both the current and the magnetic field. Thus, the typical Hall elements are configured to detect a vertical magnetic field component with a current caused to flow on a surface of a substrate (wafer).

In addition, it is known that the Hall elements can detect not only a vertical magnetic field but also a horizontal magnetic field in combination with a magnetic thin film formed of a material having high magnetic permeability, with the use of the magnetic thin film as a magnetic converging plate configured to change a direction of a magnetic flux to guide the magnetic flux to the Hall elements.

In order to realize a magnetic sensor that has a balanced ratio between vertical magnetic field sensitivity and horizontal magnetic field sensitivity and thus has a small variation in magnetic property, a positional relationship between the Hall elements and the magnetic converging plate is important (for example, see Japanese Patent Application Laid-open No. 2012-047708).

In order to reduce a variation in magnetic property due to an influence of a variation in position of the magnetic converging plate, there are a method involving patterning the magnetic converging plate on a Si substrate on which the Hall elements and a circuit are formed in advance through photolithography or the like, and a method involving forming the magnetic converging plate by plating (for example, see Japanese Patent Application Laid-open No. 2012-151285). An example is briefly described with reference to FIG. 2A to FIG. 2E.

First, as illustrated in FIG. 2A, a pair of Hall elements 2 is formed in spaced-apart relationship on a surface of a P-type semiconductor substrate 1. A protective film 3 serving as an insulator such as a polyimide film is formed on surfaces of the Hall elements 2 and the P-type semiconductor substrate 1.

Then, as illustrated in FIG. 2B, a base conductive layer 11 of a magnetic converging plate is formed on the protective film 3 serving as an insulator.

Next, as illustrated in FIG. 2C, a resist is applied on the base conductive layer 11, and a portion of the resist formed on a magnetic converging plate forming region is removed.

Then, as illustrated in FIG. 2D, the magnetic converging plate 10 is formed by plating in the region from which the resist is removed.

Finally, as illustrated in FIG. 2E, the remaining resist is removed, thereby being capable of forming the magnetic converging plate 10 in a desired region.

Further, there is also a method involving arranging, on a Si substrate on which the Hall elements and the circuit are formed, a structure for adjusting a position of a magnetic converging plate, to thereby improve accuracy of position adjustment and thus reduce a variation in magnetic property (for example, see Japanese Patent Application Laid-open No. 2003-130936).

When the magnetic converging plate is formed by plating and sputtering, in order to realize a reduction in coercive force and high magnetic permeability of a magnetic material, it is generally required to perform annealing at a high temperature equal to or higher than the Curie point. However, since annealing at such high temperature cannot be applied to the magnetic converging plate after the circuit and the Hall elements are formed, it is difficult to attain the magnetic converging plate having high magnetic permeability and low coercive force.

Further, the method involving arranging the structure for adjusting the position of the magnetic converging plate has a drawback that the number of processes increases due to additional processes such as forming the structure for position adjustment and removing the structure after the magnetic converging plate is arranged.

SUMMARY OF THE INVENTION

It is an object of the present invention to provide a magnetic sensor and a method of manufacturing the magnetic sensor capable of arranging a magnetic converging plate on a substrate on which Hall elements and a circuit are formed, with a small variation in position while suppressing an increase in number of work processes, the magnetic converging plate having high magnetic permeability and low coercive force.

In order to achieve the above-mentioned object, according to one embodiment of the present invention, the following configuration is provided.

According to the one embodiment of the present invention, there is provided a method of manufacturing a magnetic sensor having a magnetic converging plate, the method comprising: forming a recessed pattern having the same shape and size as those of a magnetic converging plate, namely, a magnetic converging plate holder in a die pad of a package on which a semiconductor substrate having Hall elements, a circuit, and the like is to be arranged; inserting, into the magnetic converging plate holder, the magnetic converging plate manufactured through processes different from those of the semiconductor substrate on which the Hall elements and the circuit are formed; and arranging the semiconductor substrate having the Hall elements, the circuit, and the like upon the magnetic converging plate holder.

With the use of the above-mentioned measure, it is possible to suppress a variation in position of the magnetic converging plate, reducing the variation in magnetic property. Further, since the magnetic converging plate holder for adjusting the position of the magnetic converging plate is formed in the die pad of the package, additional manufacturing process is needed, suppressing the manufacturing cost. Further, since the magnetic converging plate and the circuit are manufactured in the different processes, high-temperature heat treatment can be performed after a magnetic film is formed. Consequently, the magnetic converging plate having high magnetic permeability and low coercive force can be manufactured, and a magnetic sensor having higher sensitivity and higher accuracy can thus be realized.

Further, the magnetic converging plate is arranged on a back surface of a wafer, and the magnetic sensor in which an increase in offset voltage due to stress is suppressed can thus be realized.

DETAILED DESCRIPTION OF THE INVENTION

A detailed description is now given of an embodiment of the present invention with reference to the drawings.

Figure 1A:
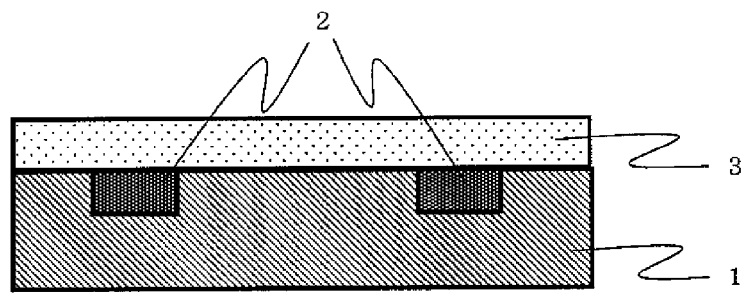
FIG. 1A to FIG. 1C are sectional views relating to a method of manufacturing a magnetic sensor according to an embodiment of the present invention.
Figure 1B:
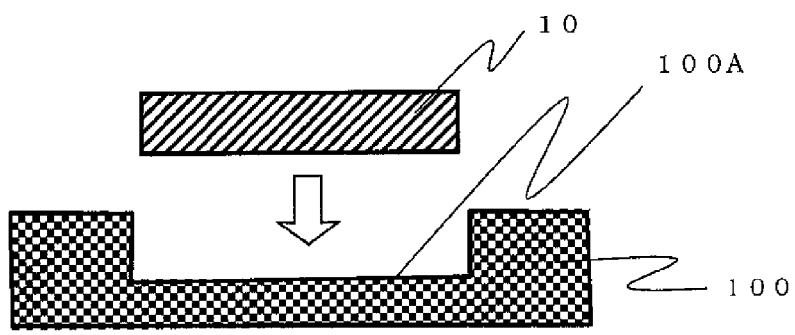
Figure 1C:
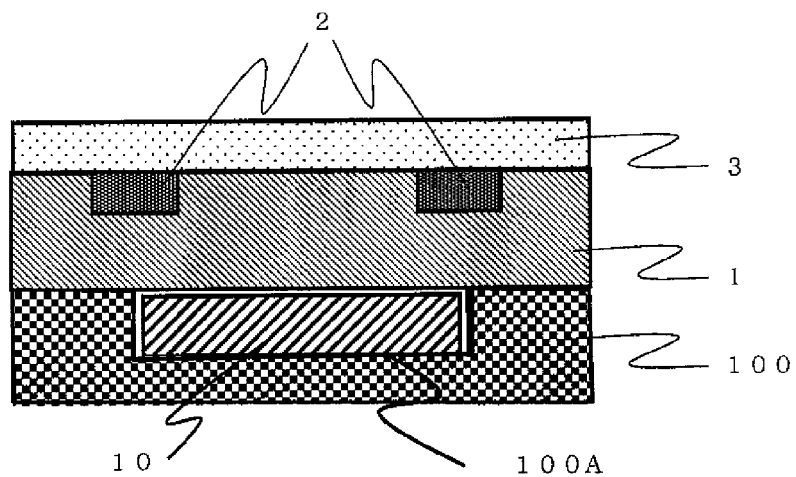
Figure 2A:
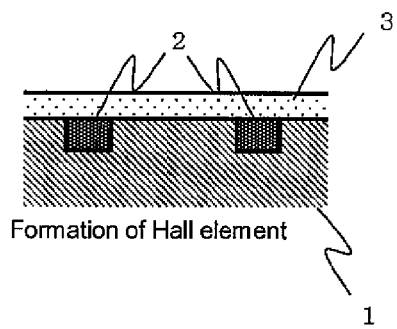
FIG. 2A to FIG. 2E are explanatory views relating to a related-art method of forming a magnetic converging plate by plating.
Figure 2B:
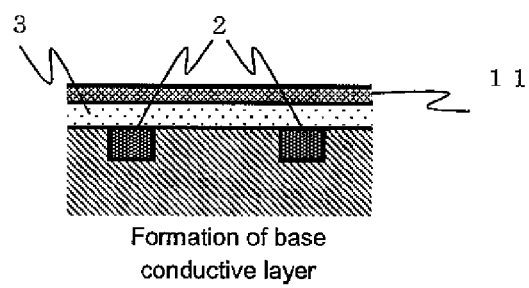
Figure 2C:
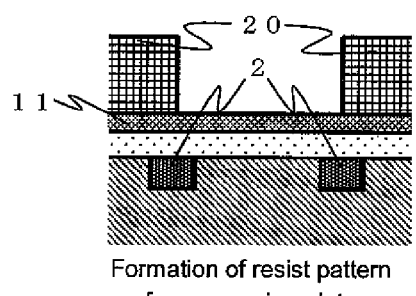
Figure 2D:
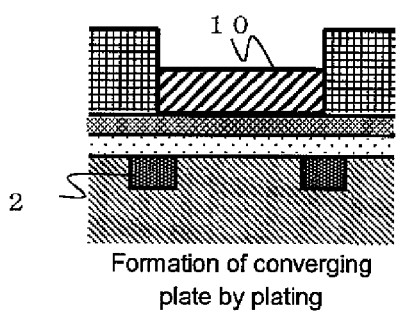
Figure 2E:
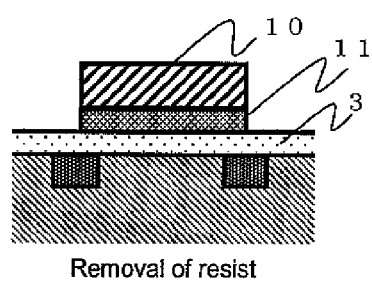

FIG. 1A to FIG. 1C are sectional views relating to a method of manufacturing a magnetic sensor according to the embodiment of the present invention.

First, as illustrated in FIG. 1A, a semiconductor circuit that forms a magnetic sensor having Hall elements 2 is formed on a P-type semiconductor substrate 1 through a normal semiconductor manufacturing process. The Hall element 2 is a horizontal Hall element having a square or cross-shaped vertical magnetic field sensing portion having a four-fold rotational axis, and, at respective vertices and end portions thereof, vertical magnetic field detection control current input terminals and vertical magnetic field Hall voltage output terminals corresponding to surface N-type highly-doped regions having the same shape. At least one pair of the Hall elements 2 is formed on a surface of the semiconductor substrate 1. Note that, a protective film 3 made of an insulating material such as polyimide is formed on the surface of the semiconductor substrate 1 on which the semiconductor circuit that forms the magnetic sensor having the Hall elements 2 is formed. After that, the semiconductor substrate 1 on which the magnetic sensors are formed is singulated, to thereby form semiconductor chips.

Next, a die pad 100 of a package is described with reference to FIG. 1B. The die pad 100 of the package has approximately the same size in a plan view as that of the semiconductor chip on which the magnetic sensor is formed, which is obtained through singulation of the semiconductor substrate 1. In the die pad 100, at a position in which a magnetic converging plate 10 is to be arranged, a magnetic converging plate holder 100A is formed that has a recessed pattern having the same shape and size as those of the magnetic converging plate 10. The magnetic converging plate holder 100A is, for example, a rectangular or circular recessed portion. A depth of the recessed portion and a thickness of the magnetic converging plate are adjusted so that a surface of the die pad 100 may be flush with a surface of the magnetic converging plate 10 when the magnetic converging plate 10 is accommodated in this recessed portion. In other words, a cross-sectional shape of the magnetic converging plate 10 just fits into a cross-sectional shape of the magnetic converging plate holder 100A. At this time, it is desired that the magnetic converging plate holder 100A be formed at a position that allows the Hall elements 2 formed on the semiconductor substrate 1 to be located near edges of the magnetic converging plate 10. The die pad 100 of the package is formed of an insulating material such as resin or ceramic. The die pad 100 of the package is formed with a mold, and hence a magnetic converging plate holder pattern is formed in the mold so that additional processes for package and die pad formation may be unnecessary.

FIG. 3A to FIG. 3F are plan views relating to the magnetic converging plate and the magnetic converging plate holder according to the present invention. As illustrated in FIG. 3A to FIG. 3F, the magnetic converging plate 10 has, for example, a circular, square, or cross shape having a four-fold rotational axis in a plan view, and has, at at least one point of an outer periphery thereof, a recessed portion or a protruded portion for magnetic converging plate rotation direction position adjustment. In addition, the magnetic converging plate holder 100A is formed into the same shape as that of the magnetic converging plate having the recessed portion or the protruded portion for magnetic converging plate rotation direction position adjustment so that the magnetic converging plate can be accommodated with no difficulty. In general, thin magnetic converging plates have magnetic anisotropy. Thus, through the adjustment of the position of the magnetic converging plate in the rotation direction, crystal orientation of the magnetic converging plate is adjusted and a variation in magnetic property due to the magnetic anisotropy is suppressed, to thereby attain a magnetic sensor having a small variation in property. Note that, in FIG. 3A to FIG. 3F, for convenience of description, the semiconductor substrate 1 existing between the Hall elements 2 and the magnetic converging plate 10 is transparent, that is, is not illustrated.

Further, it is preferred that the recessed portion or the protruded portion for magnetic converging plate rotation direction position adjustment be formed to be smaller than the magnetic converging plate in size so as not to affect the magnetic property of the Hall element 2. In addition, in order that the recessed portion or the protruded portion for magnetic converging plate rotation direction position adjustment does not affect the magnetic property of the Hall element when the magnetic converging plate 10 is bonded to a magnetic sensor chip having the magnetic converging plate holder 100A formed therein, it is desired that positions of the magnetic converging plate holder 3A and the recessed portion or the protruded portion for magnetic converging plate rotation direction position adjustment be designed so that the recessed portion or the protruded portion for magnetic converging plate rotation direction position adjustment may be formed greatly far from the Hall elements 2.

Figure 3A:
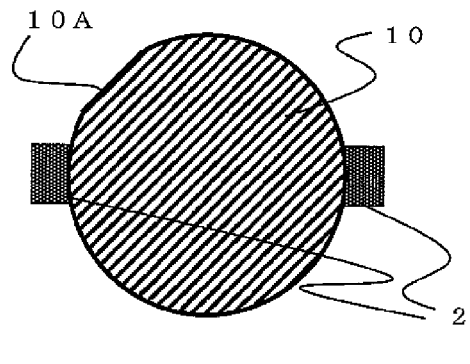
FIG. 3A to FIG. 3F are plan views relating to a magnetic converging plate and a magnetic converging plate holder according to the present invention.
Figure 3B:
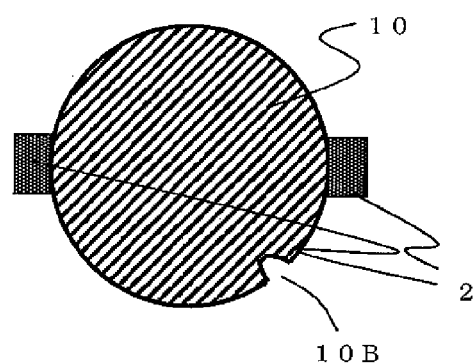
Figure 3C:
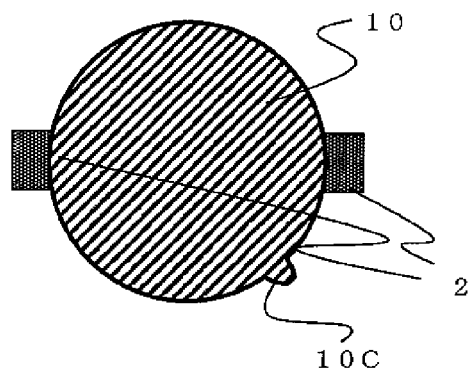
Figure 3D:
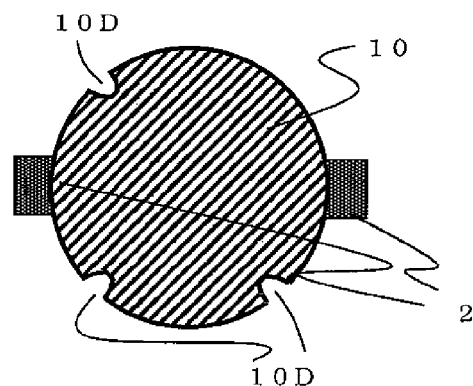
Figure 3E:
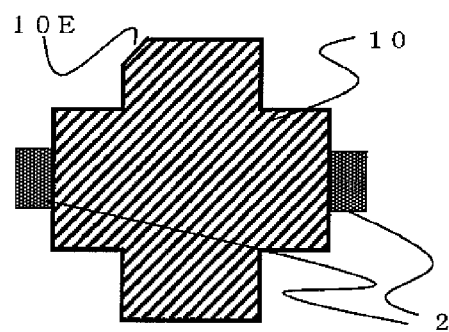
Figure 3F:
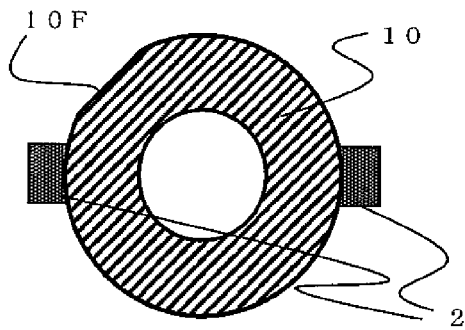

Incidentally, the magnetic converging plate 10 and the magnetic converging plate holder 100A of FIG. 3A have a circular shape having a straight line (string) portion 10A formed by cutting out part of the circle in parallel to a tangent to the circle, the straight line portion 10A being similar to an orientation flat. The magnetic converging plate 10 and the magnetic converging plate holder 100A of FIG. 3B have a circular shape having a recessed portion (notch) 10B. The magnetic converging plate 10 and the magnetic converging plate holder 100A of FIG. 3C have a circular shape having a protruded portion 10C. The magnetic converging plate 10 and the magnetic converging plate holder 100A of FIG. 3D have a circular shape having a plurality of recessed portions 10D. The magnetic converging plate 10 and the magnetic converging plate holder 100A of FIG. 3E have a cross shape having a cut corner portion 10E. The magnetic converging plate 10 and the magnetic converging plate holder 100A of FIG. 3F have a doughnut shape having a straight line (string) portion 10F formed by cutting out part of the circle in parallel to a tangent to the circle, the straight line portion 10F being similar to an orientation flat.

The magnetic converging plate is manufactured as follows independently of the semiconductor manufacturing process: a thin film is formed by plating and the like, and the thin film is processed into a shape of the magnetic converging plate.

It is desired that the magnetic converging plate be formed of a soft magnetic material having low coercive force and high magnetic permeability such as permalloy or supermalloy. In this case, when a soft magnetic thin film having low coercive force and high magnetic permeability is formed by plating and the like, it is required to perform, after the plating, high-temperature annealing treatment at a temperature of from 800° C. to 1,200° C. in a hydrogen atmosphere. The annealing treatment cannot be performed when the soft magnetic thin film is formed on the semiconductor substrate by plating, and hence it is difficult to manufacture a magnetic converging plate that has a more excellent performance and is formed of a soft magnetic material.

Further, the magnetic converging plate 10 is processed into a circular or square shape that is the same shape as that of the magnetic converging plate holder 100A. It is desired that the magnetic converging plate 10 be processed from a thin film with the use of laser processing or a mold so that a large number of magnetic converging plates 10 can be processed. It is desired that the magnetic converging plate 10 have a thickness of from about 30 μm to about 50 μm. Next, the processed magnetic converging plate 10 is bonded to the die pad 100 of the package in which the magnetic converging plate holder 100A is formed. It is desired that the magnetic converging plate 10 be bonded with an insulating adhesive dropped in the magnetic converging plate holder 100A. With regard to the bonding, position adjustment accuracy is improved due to the formation of the magnetic converging plate holder 100A, and hence the magnetic converging plate 10 can be implemented sufficiently even when bonded with the use of a chip bonder.

The semiconductor substrate 1 on which the Hall elements and the control circuit are formed is thinned by back grind to have a thickness of about 150 μm in order to reduce a distance between the Hall elements 2 and the magnetic converging plate.

After that, as illustrated in FIG. 1C, the semiconductor substrate 1 is mounted on (a back surface thereof is bonded to) the surface of the die pad 100 of the package in which the magnetic converging plate 10 is mounted. The distance between the Hall elements 2 and the magnetic converging plate 10 is large as compared to a case where the magnetic converging plate 10 is mounted on the surface of the semiconductor substrate 1, but the magnetic converging plate 10 having improved magnetic property is realized, and hence magnetic sensitivity is maintained. Further, the magnetic converging plate 10 is arranged on the back surface of the semiconductor substrate 1, and hence an influence of stress of the magnetic converging plate 10 can be suppressed more than in the case where the magnetic converging plate 10 is mounted on the surface of the semiconductor substrate 1, thereby being capable of suppressing offset voltage.

The Hall elements 2 are formed to a depth of about 5 μm from the surface of the semiconductor substrate 1, and hence the semiconductor substrate 1 may be thinned to have a thickness of about 20 μm. In this case, the distance between the Hall elements 2 and the magnetic converging plate 10 is reduced to further improve the magnetic property.

As described above, the magnetic sensor can be manufactured as follows: the magnetic converging plate subjected to high-temperature annealing is prepared, the magnetic converging plate is accommodated in the recessed portion of the die pad in which the magnetic converging plate holder is formed as the recessed portion, and the semiconductor substrate on which the Hall elements are formed and which is processed to be thin is bonded to the resultant.

With the use of the above-mentioned measure, the variation in position of the magnetic converging plate 10 is suppressed, thereby being capable of reducing the variation in magnetic property. Further, since the magnetic converging plate holder for adjusting the position of the magnetic converging plate is formed in the die pad of the package, additional manufacturing processes is needed, thereby reducing the variation in magnetic property while suppressing the manufacturing cost. Further, since the magnetic converging plate and the circuit are manufactured in the different processes, high-temperature annealing treatment can be performed after the magnetic film is formed. Consequently, the magnetic converging plate having high magnetic permeability and low coercive force can be manufactured, and the magnetic sensor having higher sensitivity and higher accuracy can thus be realized.

In addition, the magnetic converging plate is arranged on the back surface of the semiconductor substrate, thereby being capable of suppressing offset voltage.

What is claimed is:

1. A magnetic sensor, comprising:
   a semiconductor substrate;
   a pair of Hall elements formed on a surface of the semiconductor substrate so as to be separated from each other by a separation region;
   a protective film formed on the semiconductor substrate so as to cover the pair of Hall elements;
   a die pad bonded to a back surface of the semiconductor substrate so as to overlap the separation region and each of the Hall elements of the pair of Hall elements, the die pad having a magnetic converging plate holder having a recessed portion between the die pad and the back surface; and
   a magnetic converging plate having the same shape as, and fitted in, the recessed portion of the magnetic converging plate holder.

2. A magnetic sensor according to claim 1, wherein the magnetic converging plate comprises a soft magnetic material subjected to high-temperature annealing of from 800° C. to 1,200° C.

3. A magnetic sensor according to claim 1, wherein the magnetic converging plate has, at at least one point of an outer periphery of the magnetic converging plate, one of a recessed portion and a protruded portion for magnetic converging plate rotation direction position adjustment.

4. A magnetic sensor according to claim 3, wherein the magnetic converging plate holder has one of a protruded portion and a recessed portion formed into the same shape as a shape of the one of the recessed portion and the protruded portion for magnetic converging plate rotation direction position adjustment formed in the magnetic converging plate.

5. A magnetic sensor according to claim 3, wherein the one of the recessed portion and the protruded portion for magnetic converging plate rotation direction position adjustment represents a direction of magnetic anisotropy of the magnetic converging plate.

* * * * *